United States Patent [19]
McConnell et al.

[11] Patent Number: 5,872,562
[45] Date of Patent: Feb. 16, 1999

[54] UNIVERSAL REMOTE CONTROL TRANSMITTER WITH SIMPLIFIED DEVICE IDENTIFICATION

[75] Inventors: Donald P. McConnell; William R. McIntyre, both of Knoxville, Tenn.

[73] Assignee: U.S. Philips Corporation, New York, N.Y.

[21] Appl. No.: 66,405

[22] Filed: May 24, 1993

Related U.S. Application Data

[63] Continuation of Ser. No. 164,314, Mar. 4, 1988, abandoned, which is a continuation-in-part of Ser. No. 739,357, May 30, 1985, Pat. No. 4,774,511.

[51] Int. Cl.[6] .................................................. G09G 5/00
[52] U.S. Cl. ...................... 345/169; 348/734; 340/825.69
[58] Field of Search ........................ 455/603; 358/194.1; 340/825.69, 825.72, 825.71, 825.22, 825.7; 348/734; 345/169, 168, 507

[56] References Cited

U.S. PATENT DOCUMENTS

| | | | |
|---|---|---|---|
| 4,143,368 | 3/1979 | Route et al. ......................... | 455/603 X |
| 4,386,436 | 5/1983 | Kocher et al. .................... | 358/194.1 X |
| 4,413,261 | 11/1983 | Greenberg ........................... | 340/825.72 |
| 4,482,947 | 11/1984 | Zato et al. . | |
| 4,495,654 | 1/1985 | Deiss ................................ | 358/194.1 X |
| 4,514,732 | 4/1985 | Hayes ................................ | 358/194.1 X |
| 4,566,034 | 1/1986 | Harger et al. ......................... | 358/194.1 |
| 4,728,949 | 3/1988 | Platte et al. ..................... | 340/825.69 X |
| 4,746,919 | 5/1988 | Reitmeier .......................... | 358/194.1 X |

FOREIGN PATENT DOCUMENTS

| | | |
|---|---|---|
| 0117121 | 8/1984 | European Pat. Off. . |
| 0124331 | 11/1984 | European Pat. Off. . |
| 59-138195 | 8/1984 | Japan . |

OTHER PUBLICATIONS

New Collegiate Dictionary, G. & C. Merrian Co., 1979, pp. 447–448.

*Primary Examiner*—Lun-Yi Lao
*Attorney, Agent, or Firm*—Edward W. Goodman

[57] ABSTRACT

A permanent non-erasable memory stores formatting data and command bit patterns for a plurality of devices of different categories manufactured by different manufacturers to be controlled by the remote control transmitter incorporating the memory. To select the correct format, the user activates an enter initiate key, thereafter a key to indicate the category of the selected device, and thereafter two digits which together signify the manufacturer and model number. The keyboard output signals resulting from activation of the keys are stored in RAM in the microprocessor controlling the remote control transmitter's operation. The stored values in RAM constitute an address for the memory. Under microprocessor control, the data read out from memory is then applied to the transmitter driver circuit to cause the properly formatted device control signal to be transmitted.

12 Claims, 6 Drawing Sheets

UNIVERSAL REMOTE CONTROL TRANSMITTER WITH SIMPLIFIED DEVICE IDENTIFICATION

CROSS REFERENCE TO RELATED APPLICATIONS

This is a continuation of application Ser. No. 07/164,314, filed on Mar. 4, 1988, now abandoned, which is a continuation-in-part of application Ser. No. 739,357, filed May 30, 1985, now U.S. Pat. No. 4,774,511.

FIELD OF THE INVENTION

The present invention relates to remote control transmitters and, particularly, to remote control transmitters for controlling home appliances of different manufacturers and categories to carry out selected operations.

BACKGROUND OF THE INVENTION

At present, many home appliances are available which can be remotely controlled by the user. For example, a television set can be turned on and off, a channel can be selected, a video cassette recorder controlled to play or record, etc. However, each manufacturer effects this control differently. The bit pattern required to carry out a given operation differs for different manufacturers. Similarly, the basic format, such as the bit timing, the number of bits per word, the width of the pulses, the modulating frequency, if any, applied to each pulse, the presence of, length of, and format of start, lead, or trailer pulses and the number of correct receptions of a particular command required to activate the appliance to carry out the selected operation varies from manufacturer to manufacturer. The basic format may also be different for different model numbers of the same manufacturer.

Further, control of, for example, a video cassette recorder frequently requires the ability to control a related appliance, e.g. a television set, in conjunction therewith. At present, viewing a recorded program requires use of two individual remote control units, particularly if the recorder and the television set are not made by the same manufacturer. If the home is equipped with cable television, or if other appliances such as, for example, an oven can be remotely controlled, the number of required remote control transmitters becomes excessive.

Although some universal remote control transmitters with which devices of different categories and manufactured by different manufacturers can be controlled are known, these are not entirely satisfactory. All "universal" remote control transmitters have the required formatting and bit patterns data permanently stored in memory. The data for controlling the particular device must thus be read out from this memory. In some universal remote control transmitters this requires a relatively awkward setting of switches, while a time consuming process of scanning all device control signals permanently stored in the transmitter must take place in others.

SUMMARY OF THE INVENTION

It is an object of the present invention to furnish a remote control transmitter capable of controlling different types of appliances manufactured by different manufacturers which provides an easy and rapid method for reading out the correct bit pattern and formatting data from the memory storing such data for devices to be controlled.

The present invention is a direct entry system for remote control transmitters. Specifically, it is used in conjunction with remote control transmitters which transmit signals remotely controlling a selected one of a plurality of devices of different categories manufacture by different manufacturers. Each device requires a different signal format, all of the signal formats for the different categories and manufacturers being permanently stored in a memory at respective memory addresses. The user first activates an entry initiate key. Thereafter the user selects one of a plurality of keys, each signifying a particular category. Finally, the user activates at least one key (two keys in a preferred embodiment), to signify the address in the memory storing the specific device formatting data. This data is read out and applied to a microprocessor which, in turn, controls the sending of correctly formatted signals to the transmitter driver circuit. Preferably, the transmitters are infrared light emitting diodes.

Detailed operation as well the implementation of the present invention will be explained with reference to the drawing.

DESCRIPTION OF THE PREFERRED EMBODIMENTS

The present invention is disclosed herein as part of the remote control transmitter described in the copending application, Ser. No. 739,357, issued as U.S. Pat. No. 4,774,511 which is herein incorporated by reference. Only the parts of the disclosure of the parent application which are required for understanding the present invention will be repeated below. While the so-described apparatus constitutes a preferred embodiment, the present invention is also useable with other types of remote control transmitters or units.

Figure 1:
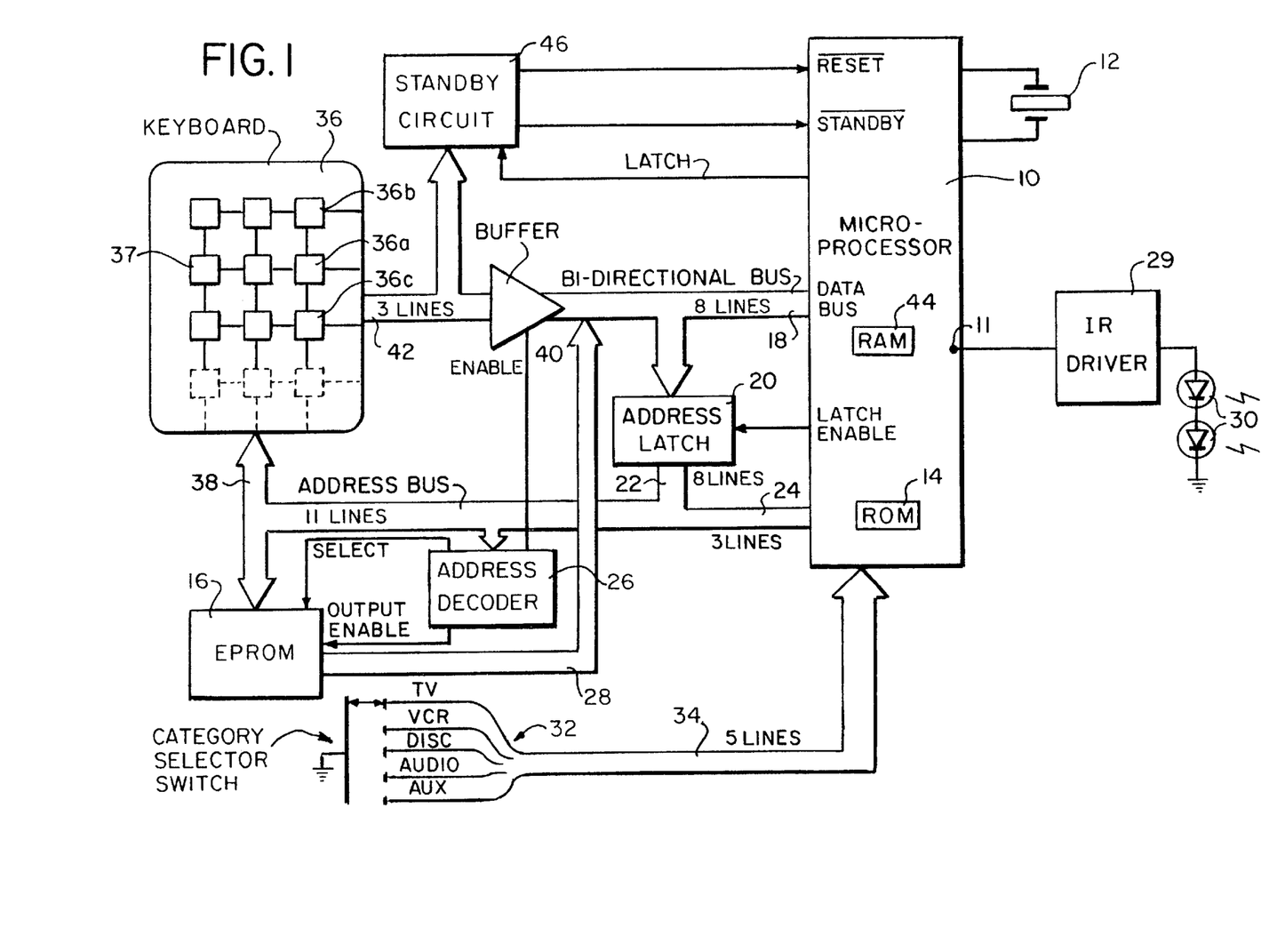
FIG. 1 is a block diagram of a remote control transmitter and associated apparatus incorporating the present invention.

Referring now to the drawing, in FIG. 1, a microprocessor, which is the central control unit for the system, is denoted by reference numeral 10. The timing of microprocessor 10 is controlled by a crystal time base 12. In normal operation, microprocessor 10 first receives data from two or even only one user-controlled selector device described in detail below. The selector device data is utilized by a "decode" program located in an internal ROM 14 of microprocessor 10 to calculate an address for an electrically programmable read only memory (EPROM) 16 separate from microprocessor 10. The memory could equally well be an EEPROM or a ROM and internal rather than external to microprocessor 10. The generated address is then put out on a two-way, eight line bus 18 and an address latch 20 is enabled. The address is stored in latch 20 and, subsequently, as timed by microprocessor 10, the address from latch 20 is applied to an eight line bus 22, and combined with the signal on three lines 24 emanating from microprocessor 10. The combined address is applied to an address decoder 26 as well as EPROM 16. Address decoder 26 first enables a "select" line and, thereafter, an "output enable" line for EPROM 16, again under microprocessor control. Data from EPROM 16 is transmitted through an eight line bus 28 and bus 18 back to microprocessor 10. The data from EPROM 16 is then used within microprocessor 10 to energize an infrared transmission drive circuit 29 so that infrared light emitting diodes 30 transmit signals with a corresponding signal structure, i.e. bit pattern and signal format. The transmitted infrared radiation is received by the appliance and causes it to operate as desired by the user.

It should be noted that the word "format" as used herein refers to parameters such as pulse width, frequency, number of bits per word, modulating frequency, if any, applied to each pulse, the presence of, length of, and shape of start, lead or trailer pulses and the number of correct receptions of a particular command required to activate the appliance to carry out the selected operation. Other parameters can be added if required, and nonrelevant parameters can be omitted depending upon the particular appliances to be controlled.

In a preferred embodiment, the microprocessor is a Hitachi HD6301 operated in mode 6 with an oscillator frequency of 4 MHz and an instruction cycle time of 1 microsecond. This speed is necessary in order to generate the carrier output frequencies of up to 55 KHz required by some IR control systems.

The first of the user-operated selector devices is a category selector switch 32, by which the user selects the category of the appliance which is to be controlled. Its output is connected to microprocessor 10 through five lines 34, the selected line being grounded. A set of category bits signifying the user-selected category is stored in a random access memory (RAM) 44 in microprocessor 10. In the example illustrated in FIG. 1, the following categories are provided: a television receiver (TV), a video cassette recorder (VCR), a disc player (disc), an audio system (audio), and an auxiliary input (aux) suitable, for example, for controlling a cable converter. This selector switch is present for functions outside of the present invention. It can be omitted with respect to the direct keyboard entry method and system according to this invention.

In accordance with the present invention, the second selector device, keyboard 36, is used for direct entry of data signifying the manufacturer and model number of the device to be controlled. This function is in addition to the other functions carried out by means of keyboard 36 in the parent application issued as U.S. Pat. No. 4,774,511 and in U.S. Pat. No. 4,703,359, a continuation-in-part of the same parent. (It should be noted that FIG. 1 hereof is identical to FIG. 1 of U.S. Pat. No. 4,703,359, both the patent and the present application being improvements on the apparatus illustrated in the parent application. Specifically, switches 30a and 30b of FIG. 1 of the parent application are omitted in both continuations-in-part. In the '359 patent, the switches are replaced by an operation in which a command is transmitted in different formats until the controlled device executes the commanded operation. In the present invention, direct entry through the keyboard of data permitting the correct address for the tables in EPROM 16 to be formed is provided instead.)

Keyboard 36 is a 3×11 matrix, addressable by 11 address lines of a bus 38. Bus 38 is constituted by eight line bus 22 and three line bus 24. During a keyboard scan, address decoder 26 enables a buffer 40, and each of the eleven columns is energized in turn by microprocessor 10 via bus 38. An output is obtained on the one of the three output lines 42 connected to an energized column by a user-depressed key. This output is then transmitted through buffer 40 and bus 18 to microprocessor 10. There, the result of the keyboard scan is stored in RAM 44. It should be noted that keyboard 36 has individual power keys marked "CBL", "VCR", and "TV", etc., respectively marked 36a, 36b and 36c in FIG. 1. It further has a record key, as well as keys numbered from one to nine and 0, channel up and down keys, etc.

The user procedure for direct keyboard entry is first to press the "entry initiate" button, then to press one of the power buttons described above in order to select the category, and then to enter two digits which together signify the manufacturer and model number. This information is available, for example, in an instruction book. This keyboard-entry data is also stored in RAM 44. As illustrated in FIG. 1, RAM 44 is internal to microprocessor 10. An external memory could be used equally well.

EPROM 16 contains command look-up tables which, according to the present invention, can be indexed or addressed by data in PAM 44 derived solely from entries on keyboard 36. Alternatively, keyboard entry data without the power button activation may be combined with category selector switch data to provide the necessary pointers for addressing items in the look-up tables in EPROM 16.

The data read out from the specific device tables, is passed to a formatter, also stored in EPROM 16. Each formatter has a device-specific program designed to generate the precise carrier frequency, pulse width, pulse modulation and overall timing format required by the particular device to be controlled.

The data output lines from keyboard 36 are also connected to the inputs of a stand-by circuit 46. A first and second output of stand-by circuit 46 is connected to a reset and stand-by input of microprocessor 10, respectively.

Standby circuit 46 was illustrated in greater detail in copending U.S. application Ser. No. 739,357. Its description will not be repeated here since it is not essential for an understanding of the present invention.

Finally, an output port 11 of microprocessor 10 is connected to IR drive circuit 29 which in turn drives infrared light emitting diodes (LED's) 30.

More detailed operation of the above-described equipment, with particular emphasis on the direct entry keyboard mode will now be described with reference to flow charts, FIGS. 2, 3, 4 and 5.

Figure 2:
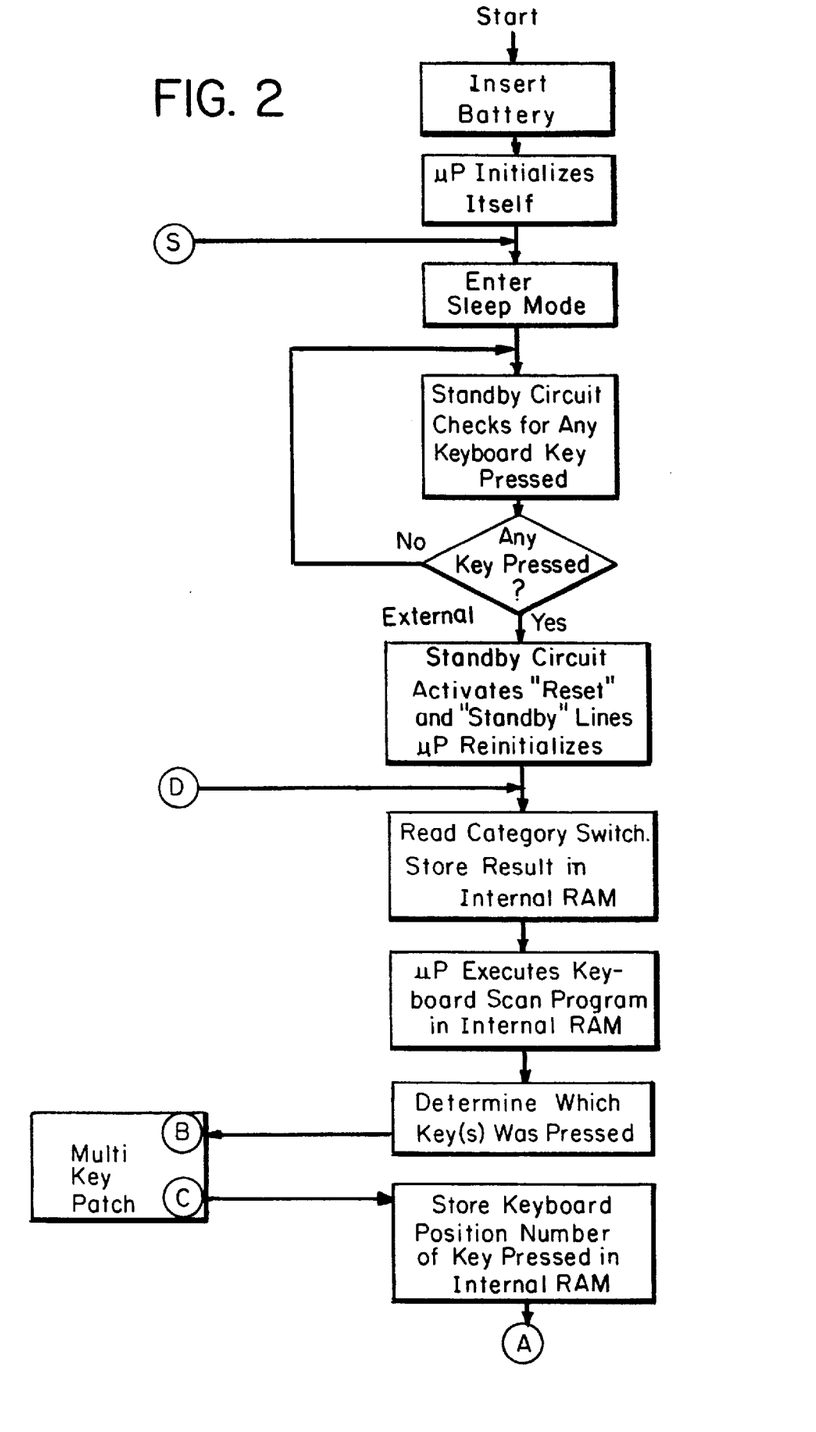
FIG. 2 is a flow chart of the main microprocessor program.

Referring now to FIG. 2, upon insertion of the battery, microprocessor initialization takes place. RAM 44, the input-output ports, and a flag in the internal memory of the microprocessor are set to initial conditions. Data in RAM 44 is set to address the first entry in the tables in EPROM 16. The microprocessor then enters the sleep mode. In this mode, stand-by circuit 46 grounds the reset and stand-by pins of the microprocessor. A circuit internal to the microprocessor shuts down all internal circuitry except for memory and the circuitry monitoring the "stand-by" and "reset" lines. This state continues until a key of keyboard 36 is pressed.

Upon pressing of a key, the "reset" and "stand-by" circuits in microprocessor 10 are energized. Monitoring of the stand-by and reset lines as well as the previously set flag causes the microprocessor to energize the Latch for stand-by circuit 46 and to enable address latch 20.

The microprocessor then executes a keyboard scan program stored in ROM 14 via bus 38. If a key on keyboard 36 is pressed, one of the keyboard rows is connected to its column, causing one of the lines of bus 42 to be at a high level at a specific step in the program. This information is utilized by a program in ROM 14 to determine the position number of any pressed key.

Figure 3:
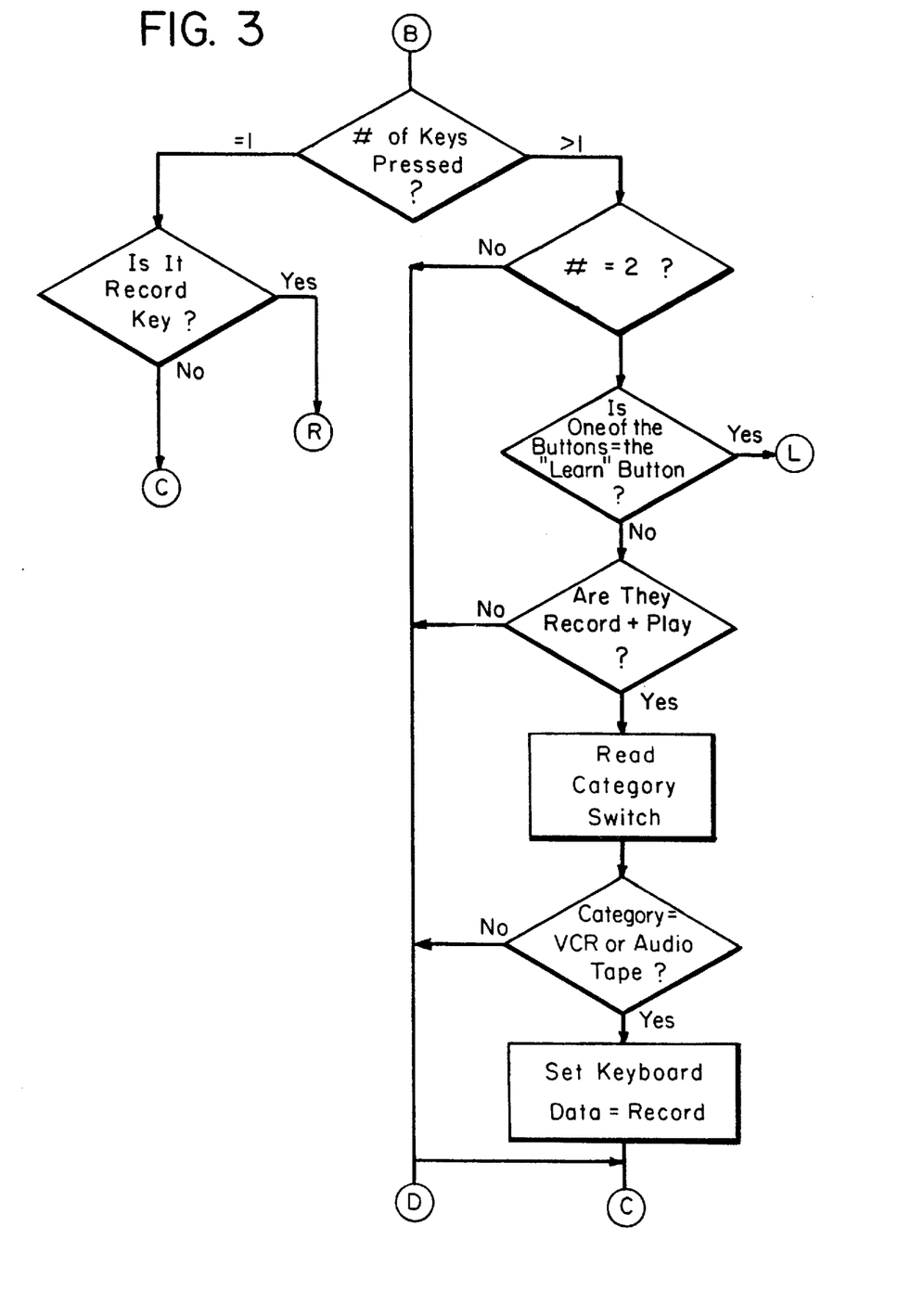
FIG. 3 is a flow chart of the multikey program.

The microprocessor then enters the multikey patch subroutine shown in FIG. 3. It is first determined whether the number of keys pressed is equal to one or greater than one. If the number is greater than one, the routine on the right hand side of FIG. 3 is followed. This routine includes the "record" mode which is irrelevant to an understanding of the present invention and will therefore not be described further herein. It also allows operation of the "learn" routine described in U.S. Pat. No. 4,703,359. This routine may be used advantageously in conjunction with the direct entry keyboard routine which is the subject of the present invention, but is not essential thereto. Specifically, the "learn" routine of U.S. Pat. No. 4,703,359 can be used to select the required signal structure data from the tables in EPROM 16 or its equivalent if the model identification digits which have to be pressed by the user for the direct entry method of this invention are not available, i.e. if, for example, the manufacturer or model number is not listed in the instruction book, or the instructions have been lost. In any case, if the number of keys pressed exceeds one, the routine is not part of the present invention and will not be described in detail herein.

If the number of keys pressed is equal to one, the microprocessor first tests whether this is the record key. If the user has pressed the record key (herein also referred to as the enter initiate key), he has taken the initial step for implementing the present invention, i.e. for entering the necessary data for identifying a particular manufacturer and model number directly on the keyboard. Therefore if the answer is yes, the subroutine illustrated in FIG. 4 is followed.

Figure 4:
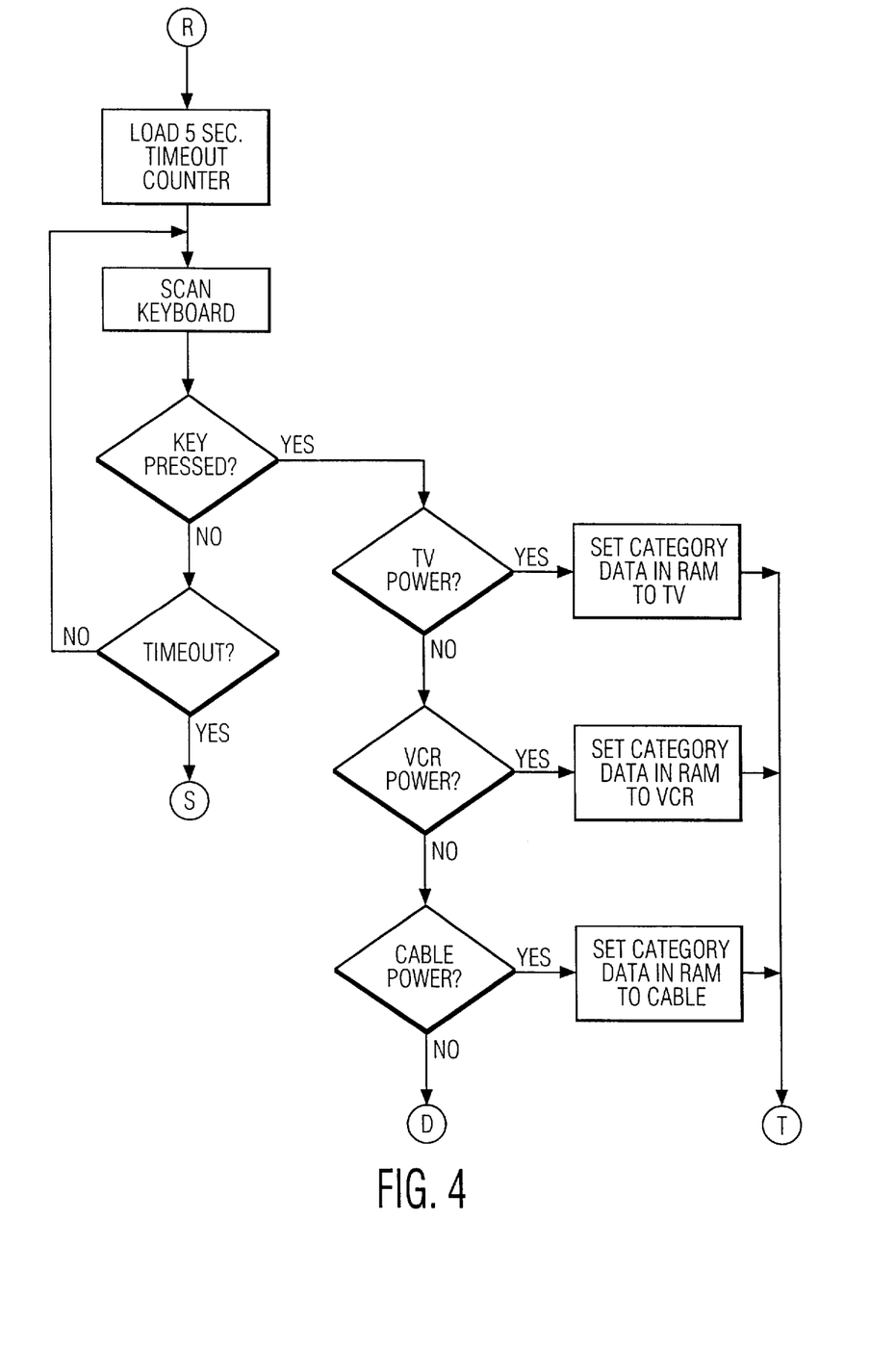
FIGS. 4 and 5 are, together, the flow chart for the direct entry identify program.

As illustrated in FIG. 4, if the key that has been pressed is the record key, a time-out counter is loaded. The keyboard is then scanned. If the user has stopped pressing the record key but has not as yet pressed another key, the "key pressed?" test which is carried out next will yield a "no". If the time-out counter has not as yet run out, the subsequent "time-out" test will also yield a "no". This will cause a repetition of the keyboard scan. If, on the other hand, the time-out counter has run down, the microprocessor goes back to the sleep mode until further activation by the user.

As mentioned above, the procedure followed by the user when directly entering the manufacturer and model identification data into the transmitter is to press one of the power buttons after pressing the record button. Thus if the "key pressed" test yields an affirmative result, the microprocessor tests which of the power buttons (three illustrated in FIG. 4) has been pressed and stores category data in RAM 44 accordingly. In an alternative embodiment, this step is replaced by positioning category selector switch 32 and entering the so-selected category data in RAM 44.

If on the other hand none of the three power buttons has been pressed, the main program of FIG. 2 is reentered at D.

Figure 5:
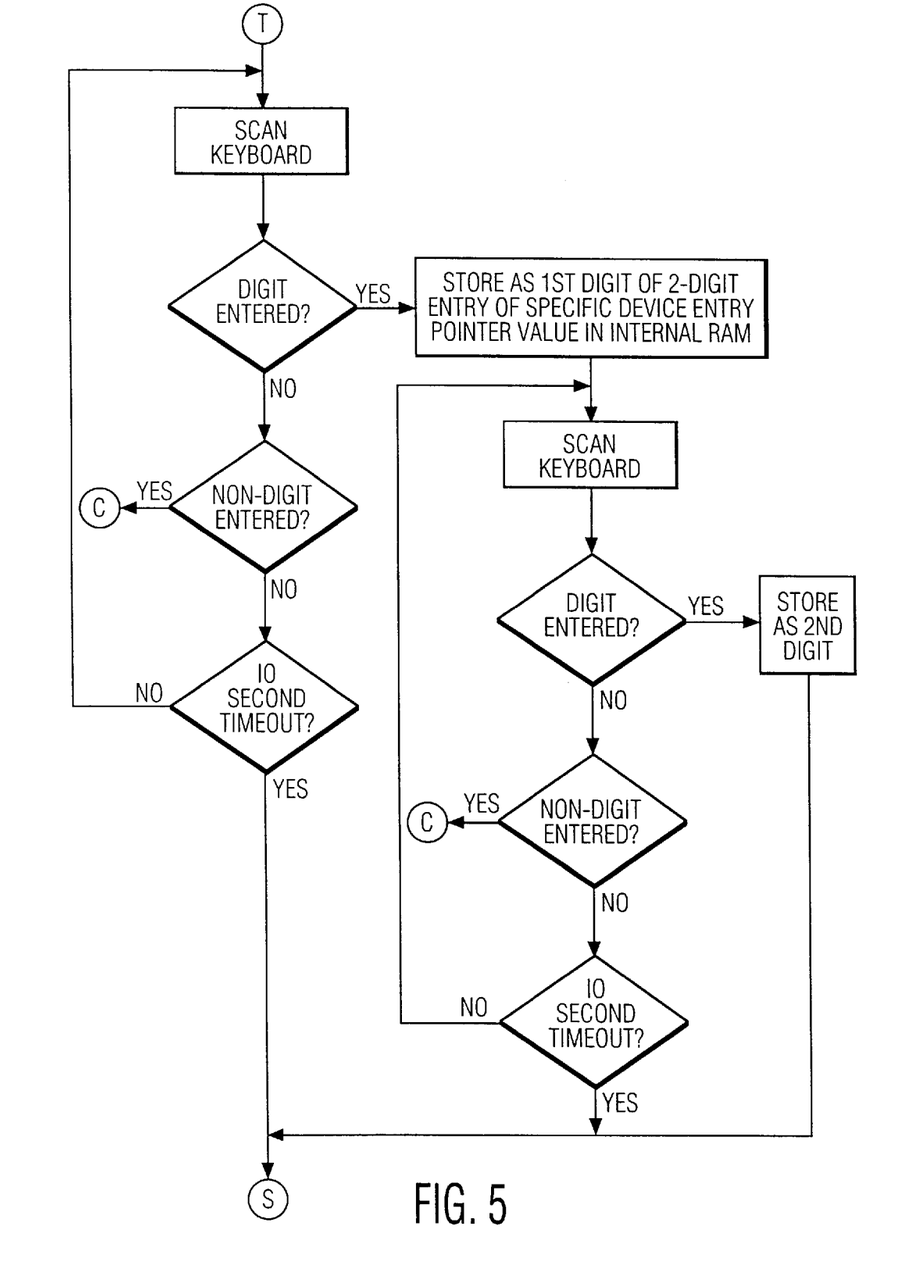

If one of the category power switches has been pressed, and the corresponding value entered in RAM 14, the program continues as illustrated in FIG. 5. The keyboard is again scanned. A test is carried out to see whether a digit has been entered. If no digit has been entered, it is tested whether a non-digit has been entered. If the answer to this is also a no, a ten second time-out is tested. If the time-out has expired, the microprocessor again returns to its sleep state. If the ten second time-out has not as yet expired, the keyboard scan is repeated.

At this point, again in accordance with the above-described procedure, the user will be entering the two digits which together identify the manufacturer and model number.

If a digit has been entered, this is stored as the first digit of the two digit specific device entry pointer or address in RAM 44. Thereafter, the keyboard is again scanned. If the next digit has been entered, this digit is stored as the second digit and the transmitter again enters its sleep state. However, the specific device data required, for example, for calculating the address of a table in EPROM 16 is now stored in RAM 44. If no digit had been entered, it is again tested whether a non-digit has been entered. If so, the main program is reentered as described above with respect to a non-digit entry. If no key at all has been pressed, the time-out clock is again checked. If the clock has run out, the equipment again returns to its sleep state.

After the circuit has been reactivated upon pressing of a new key (which will signify a desired command such as "channel up"), the category switch is read again and the result stored in internal RAM 14 (see FIG. 2). The microprocessor executes the keyboard scan program as before, and as before, the multikey patch is entered. If the key is neither the record key nor the play key, the multikey patch (FIG. 3) is exited, and the keyboard position number is stored in the internal RAM 44. (FIG. 2.)

Figure 6:
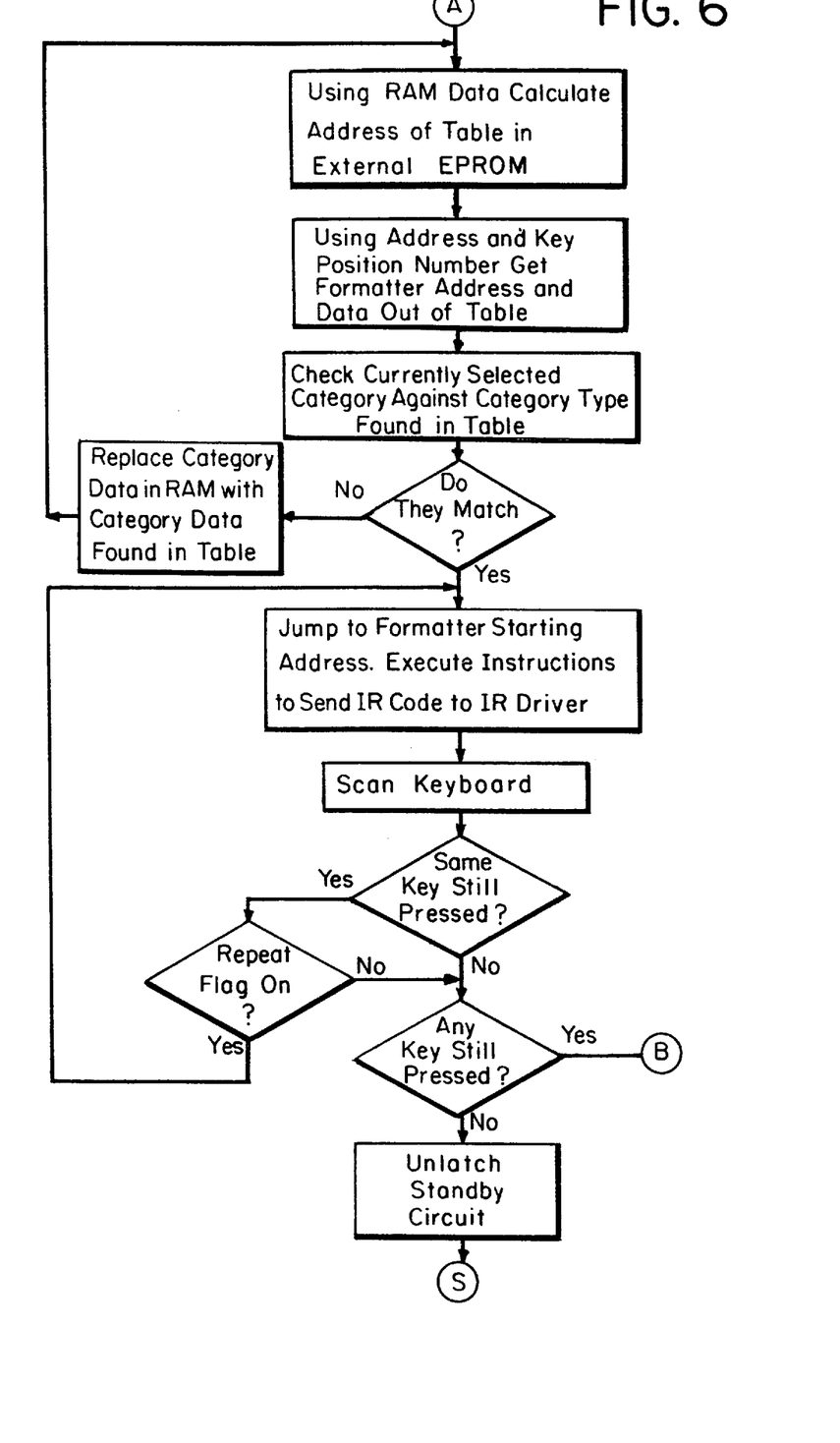
FIG. 6 is the flow chart for the transmit program.

The program then continues as illustrated in FIG. 6. The mode of operation illustrated in FIG. 6 is the send mode.

In the send mode, the "decode" program in internal ROM 14 of microprocessor 10 uses the stored category data and stored signal structure identification data (specific device pointer) to calculate the address of a command table in EPROM 16. The command table stores the following data for each key position:
1. The command word bit pattern
2. The formatter starting address
3. A repeating/not repeating flag
4. Category type The command table address calculated by the decode program is then combined with the command key data to read out the above data from EPROM 16. A comparison of the selected category type stored in RAM 44 and the category type found in the command table is carried out. If the two do not match, the category data in RAM is replaced with the category data found in the table. The program then reenters the decode program. This category matching step is required for use of commands in other categories from the one selected (e.g. T.V. volume up with VCR category selected). Since this process is explained in the parent case and is not required for understanding the present invention, no further explanation will be given here.

If a match in the category data has been found, the program jumps to the formatter starting address. Instructions are executed to send infrared code to the infrared driver. In other words, the formatter instructions stored in EPROM 16 cause the microprocessor to send the command word bit pattern to the IR driver in the format (carrier frequency, pulse type, timing, etc.) appropriate for the controlled appliance.

A renewed keyboard scan is then carried out. It is determined whether the same key is still pressed. If so, it is further tested whether the repeat flag is on. If the repeat flag is on, the program returns to the formatter starting address and the transmitter repeats sending the previously sent code.

If the same key is no longer pressed, it is determined whether any key is still pressed. If so, the program exits to the multikey program illustrated in FIG. 3. If not, the standby circuit is unlatched and the main program is reentered as illustrated in FIG. 2.

The method and apparatus of the present invention as described above allow the user to select the manufacturer and model number of the device to be controlled simply by four keyboard entries. The present invention can further be combined with the method and system disclosed in U.S. Pat.

No. 4,703,359. A remote control transmitter embodying both concepts allows the user to enter the manufacturers' model number by means of the keyboard when the keyboard entry values are available and allows the scanning method of the '359 patent to be employed if the instruction book is lost or if the instruction book does not list the particular manufacturer. Since many firms sell other manufacturers' televisions, receivers, VCR's, etc. under their own label, it is entirely possible that the scanning approach will show that the appliance can be controlled by the remote control transmitter even though no listing appeared in the instruction book.

Although the invention has been illustrated in a particular preferred embodiment, it is not intended to be limited thereto. Many variations in operation and construction will readily occur to one skilled in the art and are intended to be encompassed in the invention as set forth in the following claims.

We claim:

1. Remote control transmitter for transmitting device control signals remotely controlling a plurality of devices each belonging to a respective category of devices, at least two of said devices being of the same category of devices, and at least two being of different categories of devices, two of said devices of the same or different categories requiring a different signal format, comprising:

memory means permanently storing respective specific device formatting data for said plurality of devices at respective memory addresses;

keyboard means having a plurality of keys for providing respective keyboard output signals upon user activation of respective one of said keys, said plurality of keys including a predetermined group of keys each representing a different one of said different categories of devices, each of said memory addresses corresponding to at least one of said keyboard output signals, said keyboard output signals further comprising an entry initiate signal;

means for addressing said memory means in response to activation of said at least one of said keys following activation of one key of said predetermined group of keys and receipt of said entry initiate signal, thereby reading out said specific device formatting data for a selected device in a specific one of said different categories of devices as determined by the activated one key of said predetermined group of keys; and transmitter means operative under control of said specific device formatting data to transmit said device control signals towards said selected one of said plurality of devices in said specific one of said different categories of devices as determined by the activation of one key of said predetermined group of keys.

2. A remote control transmitter according to claim 1, wherein:
   at least two of said devices of said same category are manufactured by different manufacturers.

3. A remote control transmitter according to claim 2, wherein:
   said devices manufactured by different manufacturers require different signal formats.

4. A remote control transmitter according to claim 1, wherein:
   said transmitter means comprises an infrared transmission drive circuit including at least one infrared light emitting diode.

5. A remote control transmitter according to claim 1, wherein:
   said means for addressing said memory means addresses said memory means after said entry initiate signal in response to activation of a first key chosen from a predetermined group of keys, each of said predetermined group of keys representing said different categories of devices, and in response to activation of at least one second key representing a model number of a manufacturer of a device.

6. A remote control transmitter according to claim 1, wherein:
   in said means for addressing said memory means in response to activation of said at least one of said keys, said at least one of said keys comprises two keys, the combination of which represents a model number of a manufacturer of a device.

7. A remote control transmitter according to claim 6, wherein:
   at least two of said devices of said same category are manufactured by different manufacturers.

8. A remote control transmitter according to claim 6, wherein:
   said different categories of devices includes at least television and video cassette recorders.

9. Method for generating device control signals remotely controlling a plurality of devices each belonging to a respective category of devices, at least two of said devices being of the same category of devices, and at least two being of different categories of devices, two of said devices of the same or different categories requiring a different signal format, in a remote control transmitter having said signal formats permanently stored at respective memory addresses, said remote control transmitter further having a keyboard having a plurality of keys, said plurality of keys including a predetermined group of keys each corresponding to one of said different categories of devices, comprising the steps of
   user activation of one key in said predetermined group of keys;
   user activation of an entry initiate key;
   user activation of at least one address key, after said entry initiate key, said address key signifying the memory address storing specific device formatting data for said selected one of said plurality of devices, thereby reading out said specific device formatting data; and
   transmitting device control signals in accordance with said device formatting data to a selected category of devices and said selected one of said plurality of devices in said selected category.

10. A method according to claim 9, wherein:
    said step of user activation of at least one address key comprises
    user activation of a first key chosen from a predetermined group of keys, each of said predetermined group of keys representing said different categories of devices, and
    user activation of at least one second key representing a model number of a manufacturer of a device.

11. A method according to claim 10, wherein:
    said user activation of at least one address key comprises user activation of at least two keys, the combination of which represents a model number of a manufacturer of a device.

12. A method according to claim 10, wherein:
    at least two of said devices of said same category are manufactured by different manufacturers.

* * * * *